(12) United States Patent
Asano

(10) Patent No.: US 10,634,994 B2
(45) Date of Patent: Apr. 28, 2020

(54) IMPRINT APPARATUS, IMPRINT METHOD, METHOD OF MANUFACTURING ARTICLE

(71) Applicant: CANON KABUSHIKI KAISHA, Tokyo (JP)

(72) Inventor: Tosiya Asano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 356 days.

(21) Appl. No.: 15/456,684

(22) Filed: Mar. 13, 2017

(65) Prior Publication Data

US 2017/0269484 A1    Sep. 21, 2017

(30) Foreign Application Priority Data

Mar. 17, 2016 (JP) ................. 2016-054467

(51) Int. Cl.
*G03F 7/00* (2006.01)
*H01L 21/67* (2006.01)
*G03F 9/00* (2006.01)
*H01L 21/68* (2006.01)
*H01L 21/304* (2006.01)

(52) U.S. Cl.
CPC .......... *G03F 7/0002* (2013.01); *G03F 9/7042* (2013.01); *G03F 9/7046* (2013.01); *H01L 21/67259* (2013.01); *H01L 21/68* (2013.01); *H01L 21/304* (2013.01); *H01L 21/67092* (2013.01)

(58) Field of Classification Search
CPC .................................................. G03F 9/7042
See application file for complete search history.

(56) References Cited

U.S. PATENT DOCUMENTS

| 7,630,067 | B2 | 12/2009 | Nimmakayala et al. |
| 9,971,256 | B2* | 5/2018 | Yamamoto ............ G03F 9/7003 |
| 10,168,615 | B2* | 1/2019 | Yamashita .............. B29C 43/34 |
| 10,241,424 | B2* | 3/2019 | Asano .................... G03F 7/0002 |
| 10,406,743 | B2* | 9/2019 | Yamaguchi ............. B05B 12/02 |
| 10,481,490 | B2* | 11/2019 | Yamashita ........ H01L 21/67092 |

(Continued)

FOREIGN PATENT DOCUMENTS

| JP | 2008522412 A | 6/2008 |
| WO | 2007046820 A2 | 4/2007 |

*Primary Examiner* — Benjamin A Schiffman
(74) *Attorney, Agent, or Firm* — Rossi, Kimms & McDowell LLP

(57) ABSTRACT

An imprint apparatus forms a pattern on an imprint region of a substrate by bringing a mold into contact with an imprint material on the imprint region and curing the imprint material. The apparatus includes a controller for controlling an alignment operation of adjusting relative position between the mold and the imprint region in a state that the mold is in contact with the imprint material. The alignment operation includes a translation operation of performing relative translation between the imprint region and the mold, and a rotation operation of performing relative rotation between the imprint region and the mold. The rotation operation includes a first operation and a second operation, and a relative rotation direction between the imprint region and the mold in the second operation is opposite to a relative rotation direction between the imprint region and the mold in the first operation.

11 Claims, 9 Drawing Sheets

(56) References Cited

U.S. PATENT DOCUMENTS

| | | | |
|---|---|---|---|
| 2006/0126058 A1* | 6/2006 | Nimmakayala | B82Y 10/00 356/139.04 |
| 2010/0078854 A1* | 4/2010 | Berggren | B82Y 10/00 264/293 |
| 2011/0141489 A1* | 6/2011 | Sato | G01B 11/02 356/618 |
| 2012/0032377 A1* | 2/2012 | Montelius | B82Y 10/00 264/408 |
| 2013/0182236 A1* | 7/2013 | De Schiffart | B29C 43/021 355/74 |
| 2013/0241096 A1* | 9/2013 | Shudo | B29C 59/022 264/40.5 |
| 2014/0346700 A1* | 11/2014 | Sato | G03F 7/0002 264/40.1 |
| 2017/0246657 A1* | 8/2017 | Tamura | G03F 9/7042 |
| 2019/0317398 A1* | 10/2019 | Murakami | G03F 7/002 |

* cited by examiner

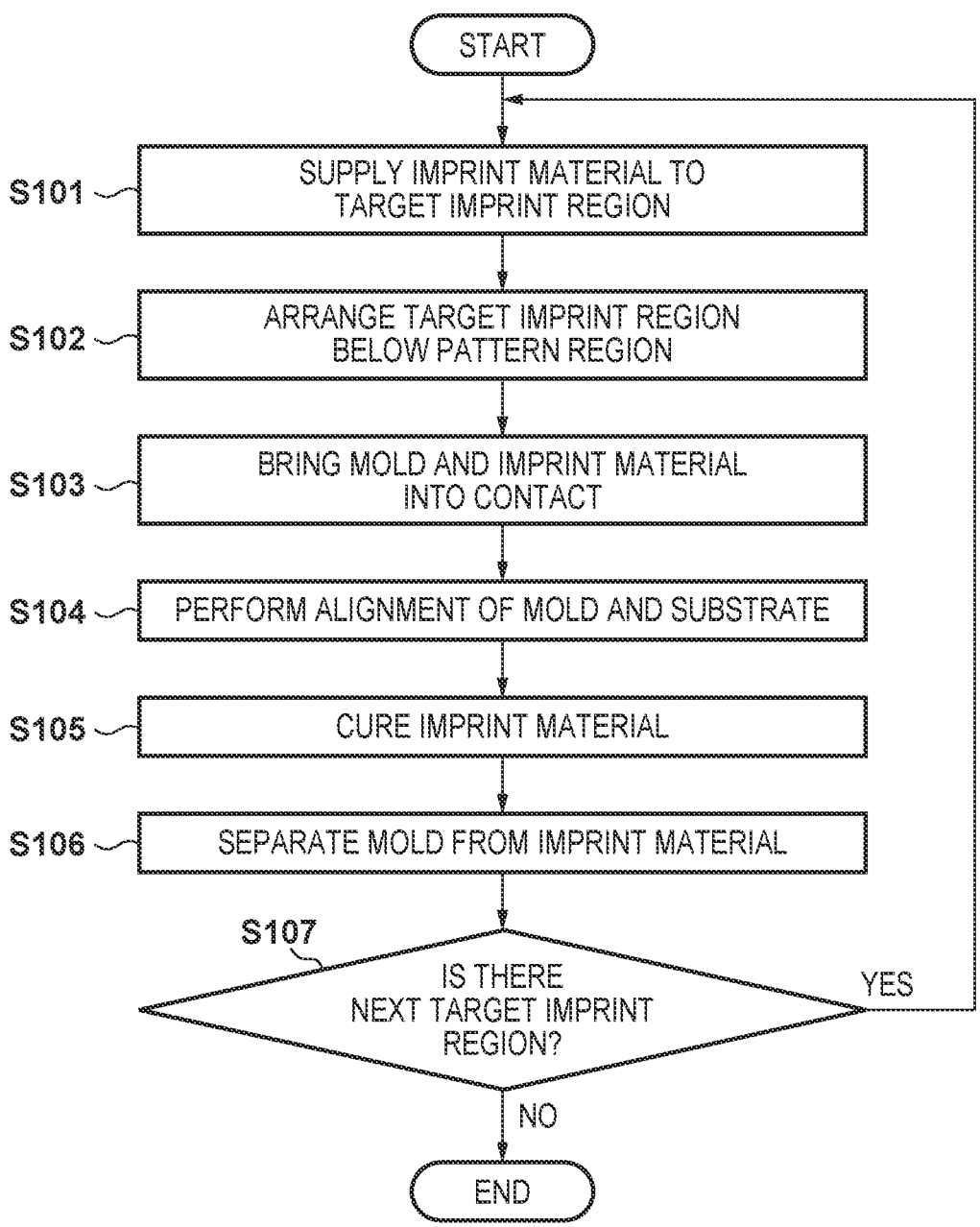

FIG. 4A
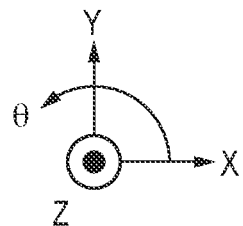
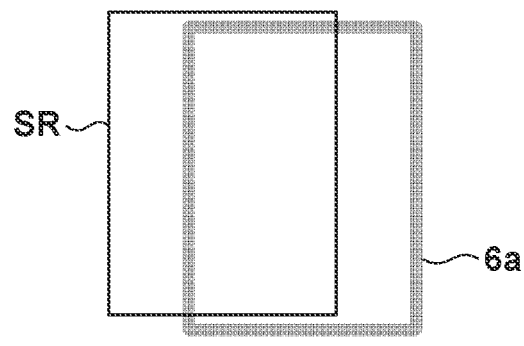
FIG. 4B
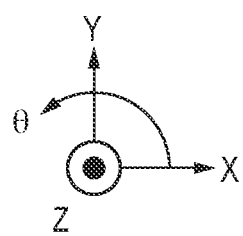
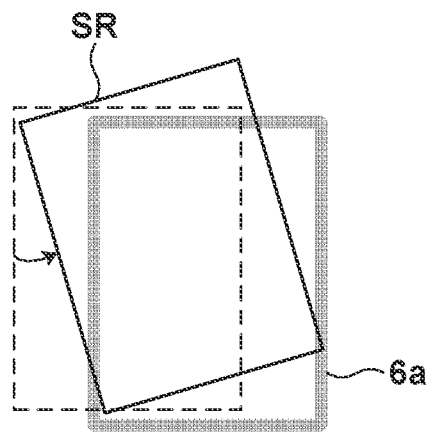
FIG. 4C
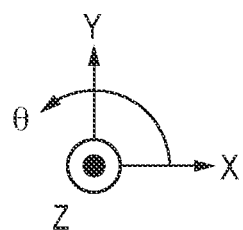
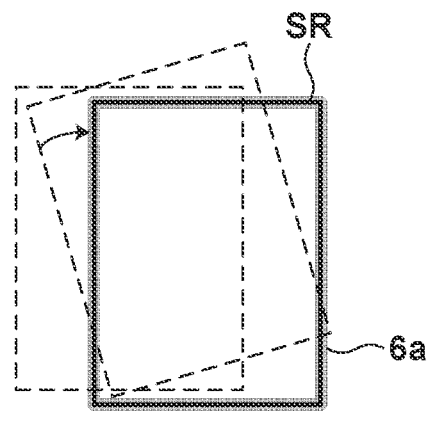

FIG. 7A
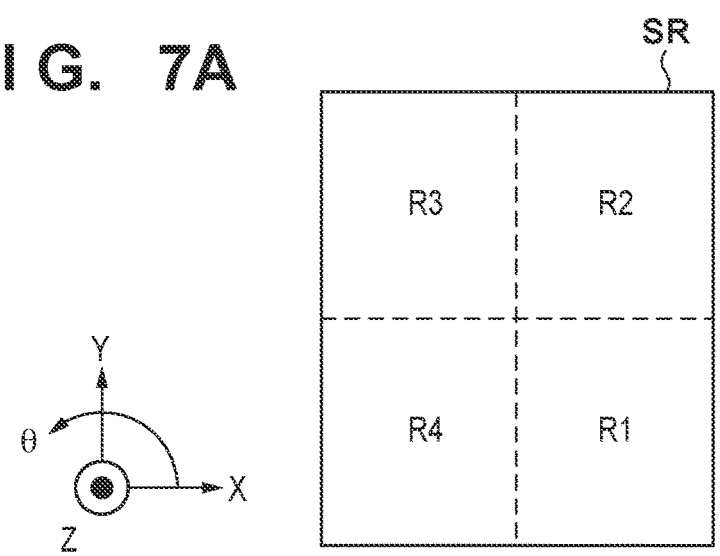
FIG. 7B
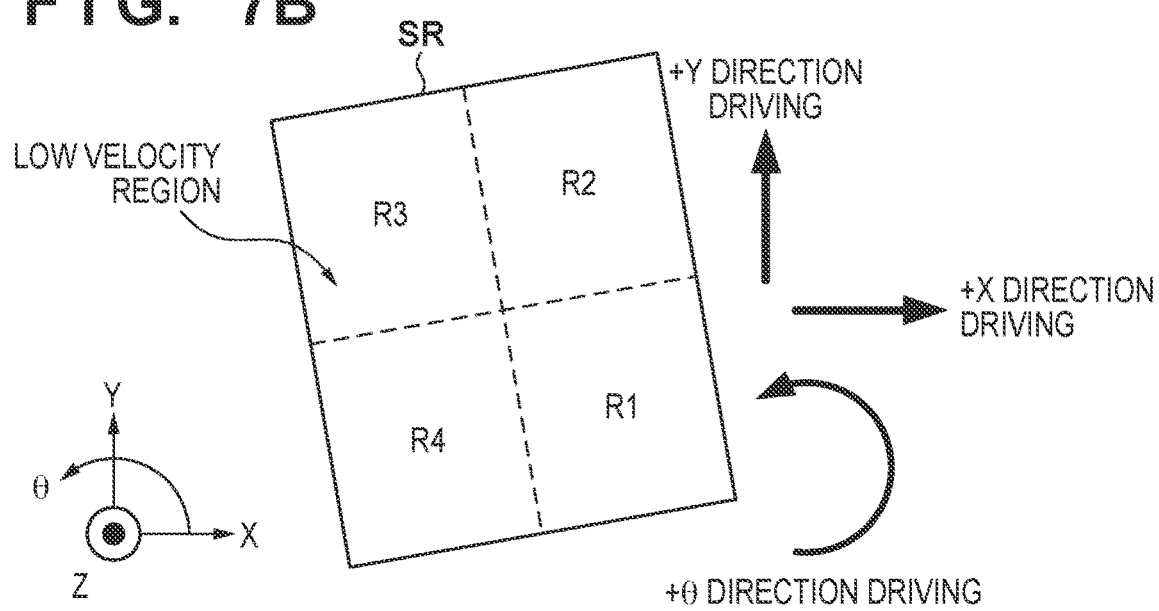
FIG. 7C
| Xe SIGN | Ye SIGN | θe SIGN | |
|---|---|---|---|
| | | + | − |
| + | + | R3 | R1 |
| + | − | R2 | R4 |
| − | + | R4 | R2 |
| − | − | R1 | R3 |

IMPRINT APPARATUS, IMPRINT METHOD, METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus has received attention as one type of lithography apparatus for manufacturing an article such as a semiconductor device or a magnetic storage medium. The imprint apparatus forms a pattern on an imprint region of a substrate by bringing a mold into contact with an imprint material arranged on the imprint region and curing the imprint material. Here, the imprint region can be a region that includes at least one shot region on the substrate. In Japanese Patent Laid-Open No. 2008-522412, there is disclosed an operation in which an alignment mark of a shot region and an alignment mark of a mold are detected to align the shot region of the substrate and the mold based on the detection result.

Alignment between the imprint region of the substrate and the mold is performed in a state in which the imprint material arranged on the imprint region is in contact with the mold. The imprint material has a property called viscoelasticity having both viscosity and elasticity. Hence, when the substrate and the mold are relatively moved in a direction along the surface, a shear force is generated in a direction that prevents relative movement due to viscoelasticity. Viscoelasticity also has a nonlinear characteristic, and the property may rapidly change due to the velocity of the relative movement or the magnitude of the shear force. If there is a rapid change in the property when the substrate and the mold are being relatively moved for alignment, overshooting in which the relative positions between the imprint region and the mold pass the alignment target can occur. Depending on the condition, this overshooting can repetitively occur by alternately changing directions, and it can be difficult for the relative positions between the imprint region of the substrate and the mold to be within allowable ranges (difficult for the alignment to converge).

SUMMARY OF THE INVENTION

The present invention provides, for example, a technique advantageous in causing alignment to converge.

One of aspects of the invention provides an imprint apparatus that forms a pattern on an imprint region of a substrate by bringing a mold into contact with an imprint material on the imprint region and curing the imprint material, the apparatus comprising: a controller configured to control an alignment operation of adjusting relative position between the mold and the imprint region in a state in which the mold is in contact with the imprint material, wherein the alignment operation includes a translation operation of performing relative translation between the imprint region and the mold, and a rotation operation of performing relative rotation between the imprint region and the mold, and the rotation operation includes a first operation and a second operation, and a relative rotation direction between the imprint region and the mold in the second operation is opposite to a relative rotation direction between the imprint region and the mold in the first operation.

Further features of the present invention will become apparent from the following description of exemplary embodiments with reference to the attached drawings.

BRIEF DESCRIPTION OF THE DRAWINGS

FIG. 3 is a flowchart showing the operation to perform an imprint process on a plurality of imprint regions of a substrate by the imprint apparatus;

FIGS. 4A to 4C are views for explaining an alignment operation principle of a mold and an imprint region of the substrate according to the embodiment of the present invention;

FIGS. 7A to 7C are views for explaining a method of determining a rotation direction and a low velocity region;

DESCRIPTION OF THE EMBODIMENTS

An exemplary embodiment of the present invention will be described below with reference to the accompanying drawings.

Figure 1:
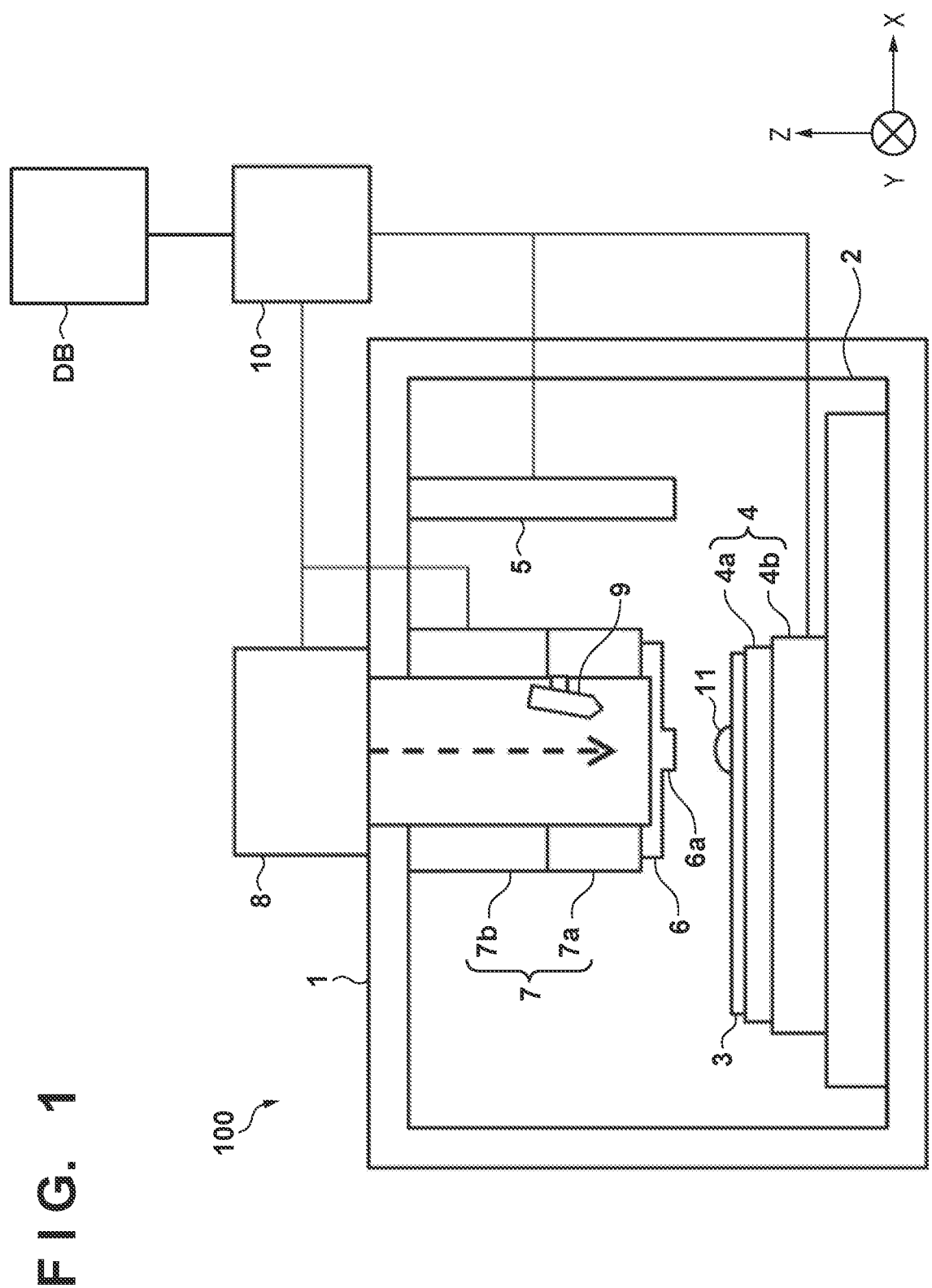
FIG. 1 is a view schematically showing the arrangement of an imprint apparatus according to one embodiment of the present invention.

FIG. 1 schematically shows the arrangement of an imprint apparatus 100 according to one embodiment of the present invention. The imprint apparatus 100 forms a pattern in an imprint region of a substrate 3 by bringing a mold 6 (more particularly, a pattern region 6a of the mold 6) into contact with an imprint material 11 arranged in the imprint region to cure the imprint material 11. The imprint region can include at least one shot region. After the imprint material 11 is cured, the mold 6 is separated from the cured imprint material 11. The imprint material 11 can be supplied or arranged on the imprint region of the substrate 3 by a supply unit 5, but may be supplied onto the substrate 3 by an apparatus different from the imprint apparatus 100. In this specification, a process of bringing the mold 6 into contact with the imprint material 11 on the substrate 3 to cure the imprint material 11 is referred to as an imprint process. The imprint process may include a process of separating the mold 6 from the cured imprint material 11.

The imprint material is a curable composition that is cured by receiving energy which cures it. The imprint material may mean the cured imprint material or the uncured imprint material. For example, an electromagnetic wave, heat or the like can be used as the curing energy. The electromagnetic wave can be, for example, light (such as infrared light, visible rays, or ultraviolet light) whose wavelength is selected from a range of 10 nm (inclusive) to 1 mm (inclusive).

Curable compositions are compositions typically cured by light irradiation or application of heat. Out of these compositions, a photo-curable composition that is cured by light can contain at least a polymerizable compound and a photopolymerization initiator. The photo-curable composition can additionally contain a non-polymerizable compound or solvent. The non-polymerizable compound can be, for example, at least a material selected from the group consisting of a sensitizer, a hydrogen donor, an internal mold release agent, a surfactant, an antioxidant, a polymer component, and the like.

In this specification and the accompanying drawings, directions are shown in an X-Y-Z coordinate system in which directions parallel to the upper surface of the substrate 3 form an X-Y plane. Let the X direction, the Y direction, and the Z direction be the directions parallel to the X-axis, the Y-axis, and the Z-axis, respectively, in the X-Y-Z coordinate system. Let θX, θY, and θZ be rotation about the X-axis, rotation about the Y-axis, and rotation about the Z-axis, respectively. Control or driving regarding the X-axis, the Y-axis, and the Z-axis means control or driving regarding the direction parallel to the X-axis, the direction parallel to the Y-axis, and the direction parallel to the Z-axis, respectively. Further, control or driving regarding the θX-axis, the θY-axis, and the θZ-axis means control or driving regarding rotation about an axis parallel to the X-axis, rotation about an axis parallel to the Y-axis, and rotation about an axis parallel to the Z-axis, respectively. A position is information that can be specified based on X-axis, Y-axis, and Z-axis coordinates. A rotation angle is information that can be specified based on a value of the θZ-axis. An orientation is information that can be specified by values of the θX-axis and the θY-axis. Performing alignment means controlling the positions and/or the rotation angle.

The imprint apparatus 100 can include, for example, an imprint head 7, a substrate stage 4, a curing unit 8, the supply unit 5, a measurement device 9, and a controller 10. A structure 1 can support the imprint head 7, the curing unit 8, the supply unit 5, and the measurement device 9. The substrate stage 4 is configured to move the substrate 3 on a base 2. The controller 10 includes, for example, a CPU and a memory, and controls the imprint process (controls the respective units of the imprint apparatus).

The mold 6 is generally made of a material such as quartz capable of transmitting ultraviolet light. A pattern for molding the imprint material 11 on the substrate 3 is formed in the pattern region 6a which is a partial region on a surface facing the substrate 3. The pattern is formed by a concave portion, and a pattern of a convex portion is formed by the imprint material 11 by curing the imprint material 11 in a state in which the concave portion is filled with the imprint material 11. The substrate 3 can be, for example, a single crystal silicon substrate or a glass substrate.

The curing unit 8 cures the imprint material 11 on the imprint region by supplying energy which cures the imprint material 11, for example, light such as ultraviolet light, to the imprint material 11 via the mold 6 in the imprint process. The curing unit 8 can include, for example, a light source that emits the light which cures the imprint material 11 and an optical element for adjusting the light emitted from the light source to light suitable for the imprint process.

The measurement device 9 detects the positional shift between a mark provided in the pattern region 6a of the mold 6 and a mark provided in the imprint region of the substrate 3. Based on a detection result by the measurement device 9, the controller 10 can recognize the relative positions between the imprint region of the substrate 3 and the mold 6 (more particularly, the pattern region 6a of the mold 6). That is, the controller 10 can use the measurement device 9 to measure the relative positions between the mold 6 and the imprint region. The relative positions include relative positions and relative rotation angles.

The imprint head 7 can include, for example, a mold holder 7a and a mold driver 7b. The mold holder 7a holds the mold 6 by a vacuum chuck force, an electrostatic chuck force, or the like. The mold driver 7b drives the mold holder 7a so as to drive the mold holder 7a with respect to a plurality of axes (for example, the six axes of the X-axis, the Y-axis, the Z-axis, the θX-axis, the θY-axis, and the θZ-axis). Each of the mold holder 7a and the mold driver 7b has an opening region in its center portion (inside), and the energy from the curing unit 8 can pass through the opening region and be supplied to the imprint material 11 on the substrate via the mold 6.

The substrate stage 4 can include, for example, a substrate chuck 4a which holds the substrate 3 by the vacuum chuck force, the electrostatic chuck force, or the like, and a substrate driver 4b which mechanically holds and drives the substrate chuck 4a with respect to the plurality of axes on the base 2. For example, the substrate driver 4b can be configured to drive the substrate chuck 4a with respect to the three axes of the X-axis, the Y-axis, and the θZ-axis, but may also be configured to drive the substrate chuck 4a with respect to all or some of the other axes (the Z-axis, the θX-axis, and the θY-axis).

In one example, the substrate driver 4b can perform control of the relative positions between the mold 6 and the substrate 3 (more particularly, the imprint region of the substrate 3) with respect to the X-axis, the Y-axis, and the θZ-axis. However, the mold driver 7b or both the substrate driver 4b and the mold driver 7b may perform the control. In one example, the imprint head 7 performs control (control with respect to the Z-axis) of the distance between the substrate 3 and the mold 6. However, the mold driver 7b or both the substrate driver 4b and the mold driver 7b may perform the control.

Figure 2A:
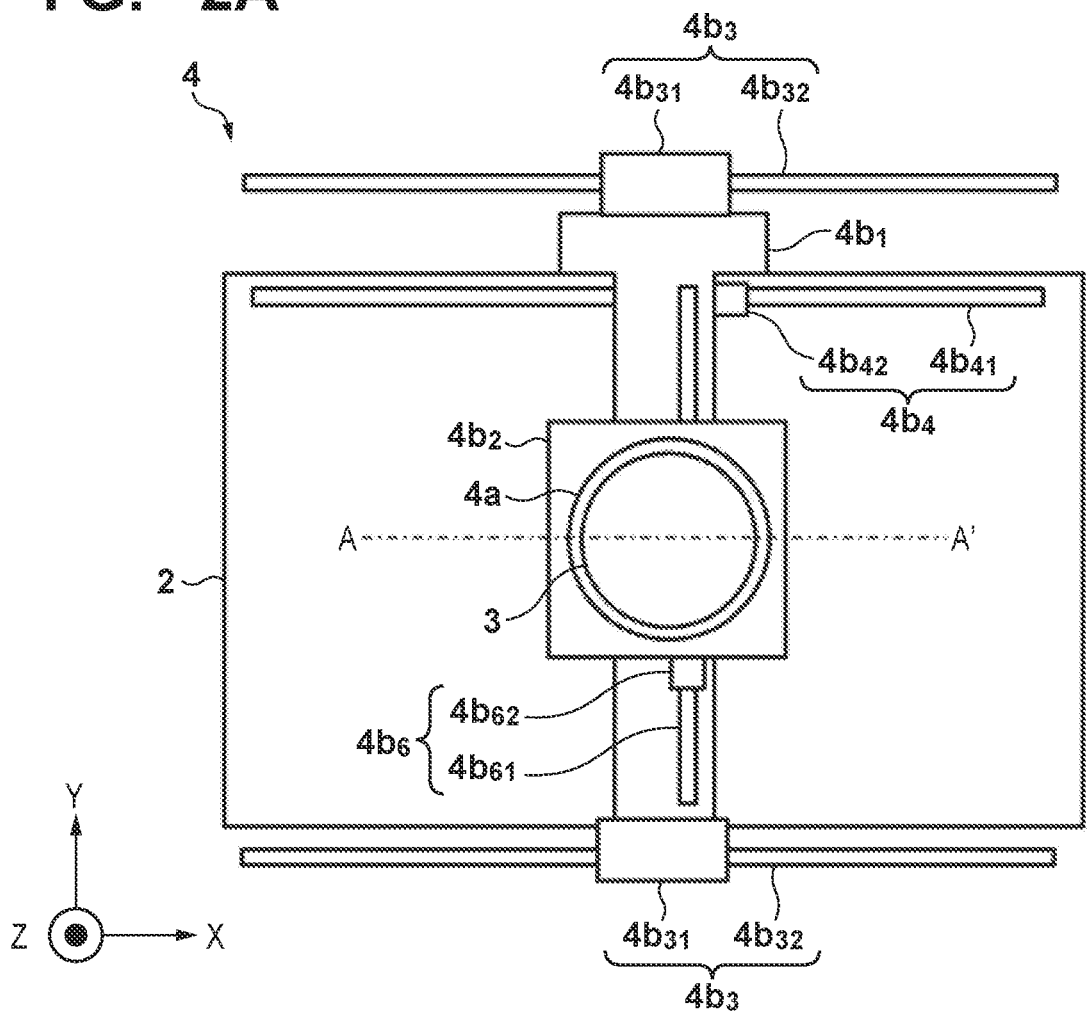
FIGS. 2A and 2B are views each schematically showing the arrangement of a substrate stage.
Figure 2B:
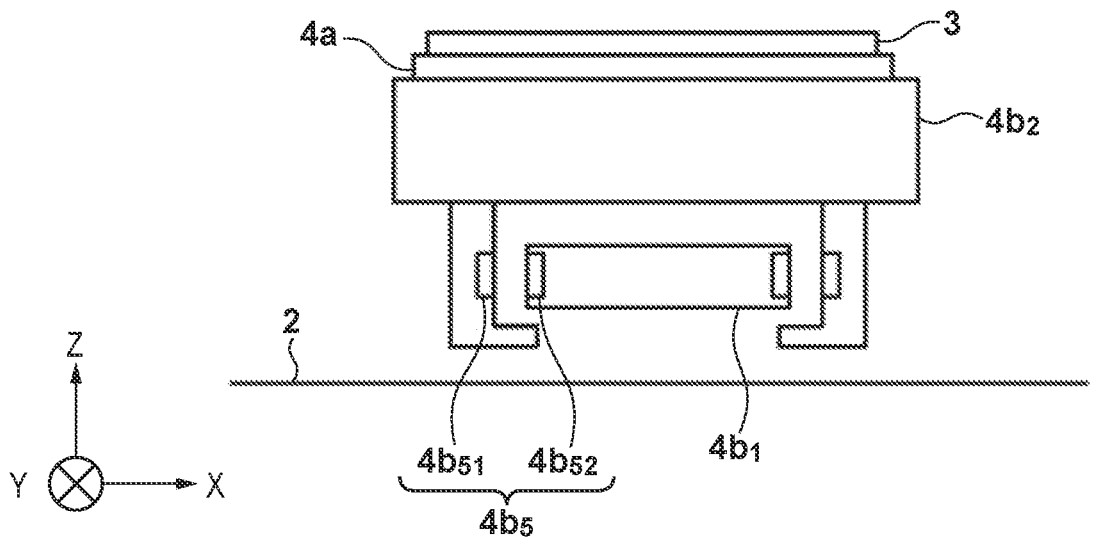

FIGS. 2A and 2B show an example of the arrangement of the substrate stage 4. FIG. 2A is a view showing the substrate stage 4 in the Z direction. FIG. 2B is a sectional view taken along a line A-A' of FIG. 2A. The substrate stage 4 includes the substrate chuck 4a and the substrate driver 4b. The substrate driver 4b can include, for example, an X stage $4b_1$ (first stage) and a Y stage (second stage) $4b_2$. The X stage $4b_1$ is configured to move, by a static pressure guide (not shown), on the base 2 in the first direction (for example, the X direction). The Y stage $4b_2$ is configured to support the substrate chuck 4a and move, by the static pressure guide (not shown), on the X stage $4b_1$ in the second direction (for example, the Y direction) different from the first direction. The substrate driver 4b thus configured can move the Y stage $4b_2$ and the substrate chuck 4a (substrate 3) in the X direction by driving the X stage $4b_1$ in the X direction. The substrate driver 4b can also move the substrate chuck 4a (substrate 3) in the Y direction by driving the Y stage $4b_2$ in the Y direction. That is, the substrate driver 4b can move the substrate 3 in the X direction and the Y direction by driving the X stage $4b_1$ in the X direction and driving the Y stage $4b_2$ in the Y direction.

A first driver $4b_3$ drives the X stage $4b_1$ on the base 2 in the X direction. The first driver $4b_3$ can include, for example, a linear motor that includes a mover $4b_{31}$ which includes a permanent magnet and a stator $4b_{32}$ which includes a plurality of coils arrayed in the X direction. Then, the first driver $4b_3$ can drive the X stage $4b_1$ in the X direction by controlling a current supplied to the plurality of coils in the stator $4b_{32}$ to move the mover $4b_{31}$ along the stator $4b_{32}$. For example, a first detector $4b_4$ constituted by an encoder, an interferometer, or the like can detect the position of the X stage $4b_1$ in the X direction. In the example shown in FIGS.

2A and 2B, an encoder that includes a scale $4b_{41}$ and a head $4b_{42}$ which obtains the position of the X stage $4b_1$ in the X direction by reflected light from the scale $4b_{41}$ is provided as the first detector $4b_4$.

A second driver $4b_5$ drives the Y stage $4b_2$ on the X stage $4b_1$ in the Y direction. As shown in FIG. 2B, the second driver $4b_5$ can include, for example, a linear motor that includes a mover $4b_{51}$ which includes a permanent magnet and a stator $4b_{52}$ which includes a plurality of coils arrayed in the Y direction. Then, the second driver $4b_5$ can drive the Y stage $4b_2$ in the Y direction by controlling a current supplied to the plurality of coils in the stator $4b_{52}$ to move the mover $4b_{51}$ along the stator $4b_{52}$. For example, a second detector $4b_6$ constituted by an encoder, an interferometer, or the like can detect the position of the Y stage $4b_2$ in the Y direction. In the example shown in FIGS. 2A and 2B, an encoder that includes a scale $4b_{61}$ and a head $4b_{62}$ which obtains the position of the Y stage $4b_2$ in the Y direction by reflected light from the scale $4b_{61}$ is provided as the second detector $4b_6$.

A radial guide (not shown) is provided between the Y stage $4b_2$ and the substrate chuck $4a$. The substrate chuck $4a$ is supported with high rigidity in the X-axis and Y-axis directions, and is configured to move freely only in the θZ direction of the rotation about the Z-axis. A voice coil motor and an encoder (not shown) are provided between the Y stage $4b_2$ and the substrate chuck $4a$. The encoder measures the θZ displacement of the substrate chuck $4a$. Positioning control of the substrate chuck in the θZ direction is performed with a control force by the voice coil motor.

FIG. 3 shows the operation to perform an imprint process on a plurality of imprint regions on the substrate 3 by the imprint apparatus 100. This operation is controlled by the controller 10. In step S101, the controller 10 controls the substrate stage 4 so that an imprint region (to be referred to as a target imprint region hereinafter) as a target to perform an imprint process is arranged below the supply unit 5 and controls the supply unit 5 so that the imprint material 11 is supplied to a target imprint region $3a$. The imprint material 11 may be supplied to the target imprint region $3a$ without changing the positions of the target imprint region $3a$ and the supply unit 5 or by relatively scanning the target imprint region $3a$ and the supply unit 5. In step S102, the controller 10 controls the substrate stage 4 so as to arrange the target imprint region $3a$ below the pattern region $6a$ of the mold 6. In step S103, the controller 10 controls the imprint head 7 so as to reduce the spacing between the mold 6 and the substrate 3 to bring the mold 6 and the imprint material 11 on the target imprint region $3a$ into contact. The controller 10 causes the imprint head 7 of the mold driver $7b$ to generate a force that brings the mold 6 and the imprint material 11 into contact so that the pattern corners of the pattern region $6a$ of the mold 6 are filled with the imprint material 11. The force that brings the mold 6 and the imprint material 11 into contact is, for example, a force to press the mold 6 against the imprint material 11 and is referred to as a pressing force hereinafter. After a predetermined time has elapsed in a state in which the pressing force is generated by the mold driver $7b$, the controller 10 cancels the generation of the pressing force by the mold driver $7b$. At this time, the pressing force need not be completely zero but may slightly remain.

In step S104, the controller 10 performs alignment of the mold 6 (more particularly, the pattern region $6a$ of the mold 6) and the substrate 3 (more particularly, the target imprint region of the substrate 3) based on the measurement result obtained by the measurement device 9. For example, the controller 10 causes the measurement device 9 to detect the positional shifts between the mark of the pattern region $6a$ and the mark of the target imprint region $3a$ and obtains the relative positions between the pattern region $6a$ and the target imprint region $3a$ with respect to the X-, Y-, and θZ-axes based on the detection result. This process is an example of a process of measuring the relative positions of the pattern region $6a$ and the target imprint region $3a$ by using the measurement device 9. Based on the measurement result obtained by using the measurement device 9, the controller 10 performs alignment between the mold 6 (more particularly, the pattern region $6a$ of the mold 6) and the substrate 3 (more particularly, the target imprint region of the substrate 3) with respect to the X-, Y-, and θZ-axes. More specifically, the controller 10 controls the positions and the rotation angle of the mold 6 and/or the substrate 3 so that the relative positions between the mold 6 and the substrate 3 with respect to the X-, Y-, and θZ-axes are within allowable ranges.

In step S105, the controller 10 controls the curing unit 8 so as to supply an energy to the imprint material 11 which was brought into contact with the mold 6, thereby curing the imprint material 11. In step S106, the controller 10 controls the imprint head 7 so as to increase the spacing between the mold 6 and the substrate 3 and separates the mold 6 from the imprint material 11. In step S107, the controller 10 determines whether there is an imprint region (next imprint region) on the substrate 3 to which the pattern of the mold 6 is be successively transferred. If there is a next imprint region, the process advances to step S101. Otherwise, the process ends.

The principle of an alignment operation between the mold 6 (more particularly, the pattern region $6a$ of the mold 6) and an imprint region SR of the substrate 3 according to this embodiment will be described with reference to FIGS. 4A to 4C. FIG. 4A exemplifies the relative positions between the pattern region $6a$ of the mold 6 and the imprint region SR before an alignment operation is performed. FIG. 4B exemplifies the relative positions between the pattern region $6a$ of the mold 6 and the imprint region SR partway through the alignment operation. FIG. 4C exemplifies the relative positions between the pattern region $6a$ of the mold 6 and the imprint region SR after the alignment operation has ended.

The alignment operation includes a translation operation (X-axis and Y-axis driving operation) of relatively translating the imprint region SR with respect to the mold 6 and a rotation operation (θZ-axis driving operation) of relatively rotating the imprint region SR with respect to the mold 6. The rotation operation includes a first operation (FIG. 4B) of relatively rotating the imprint region SR with respect to the mold 6 and a second operation (FIG. 4C) of relatively rotating the imprint region SR with respect to the mold 6. Here, the relative rotation direction of the imprint region SR with respect to the mold 6 in the second operation is opposite to the relative operation direction of the imprint region SR with respect to the mold 6 in the first operation.

If only the translation operation is performed, the relative velocity of the imprint region SR with respect to the mold 6 is the same in all positions or partial regions of the imprint region SR. The drag (force that prevents the relative movement) due to viscoelasticity of the imprint material 11 in the relative movement between the mold 6 and the imprint region SR rapidly decreases when the relative velocity between the mold 6 and the imprint region SR exceeds a predetermined threshold. Hence, when the relative velocity between the mold 6 and the imprint region SR exceeds the predetermined threshold, the relative positions between the mold 6 and the imprint region SR can rapidly change, and overshooting in which the target values of the relative positions are exceeded can occur.

Figure 5:
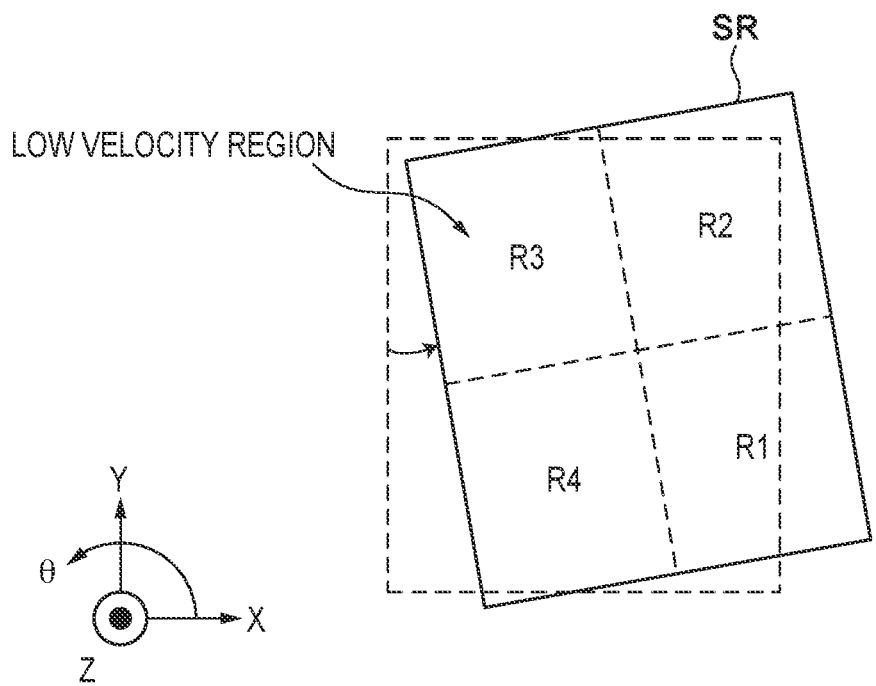
FIG. 5 is a view for explaining a principle according to the embodiment of the present invention.

Therefore, in this embodiment, a rotation operation is performed in addition to the translation operation. Performing this rotation operation can cause the relative velocity of the imprint region SR with respect to the mold 6 to vary in accordance with the position or the partial region of the imprint region SR. FIG. 5 exemplifies partial regions R1 to R4 obtained by quartering the imprint region SR. In the example shown in FIG. 5, in a case in which the imprint region SR is relatively rotated with respect to the mold 6 in a positive direction of the θZ-axis, the partial region R3 becomes a low velocity region having a lower relative velocity with respect to the mold 6 than the other partial regions R1, R2, and R4. In this embodiment, the relative velocity in the low velocity region is set to a velocity which is sufficiently lower than the threshold at which the viscoelasticity of the imprint material 11 rapidly changes. This allows the viscoelasticity of the imprint material 11 to act as a brake in the low velocity region even when the relative velocities of the respective partial regions R1, R2, and R4 exceed the threshold. Thus, overshooting can be suppressed by this brake action. The position of the low velocity region in the imprint region SR depends on the relative velocities of the X-axis, Y-axis, and the θZ-axis. For the X-axis and the Y-axis, an alignment operation can be performed by feedback control based on the measurement result obtained by using the measurement device 9. Hence, the controller 10 can be configured to determine the relative velocity of the θZ-axis so that the low velocity region is formed based on an operation amount, a control amount, or an estimated position of the feedback control with respect to the X-axis and the Y-axis.

The rotation operation in the alignment operation may include the following first and second operations. The first operation can be an operation to relatively rotate the imprint region SR with respect to the mold 6 so as to make the relative velocity between the mold 6 and the first partial region (for example, the partial region R3) lower than that between the mold 6 and the second partial region (for example, the partial region R4). The second operation can be an operation to relatively rotate the imprint region SR with respect to the mold 6 so as to make the relative velocity between the mold 6 and the second partial region (for example, the partial region R4) lower than that between the mold 6 and the first partial region (for example, the partial region R3). In this example, the first partial region is set as the low velocity region in the first operation, and the second partial region is set as the low velocity region in the second operation. The low velocity region can be changed in the alignment operation in this manner to suppress overshooting and end the alignment operation in a short period.

Figure 6:
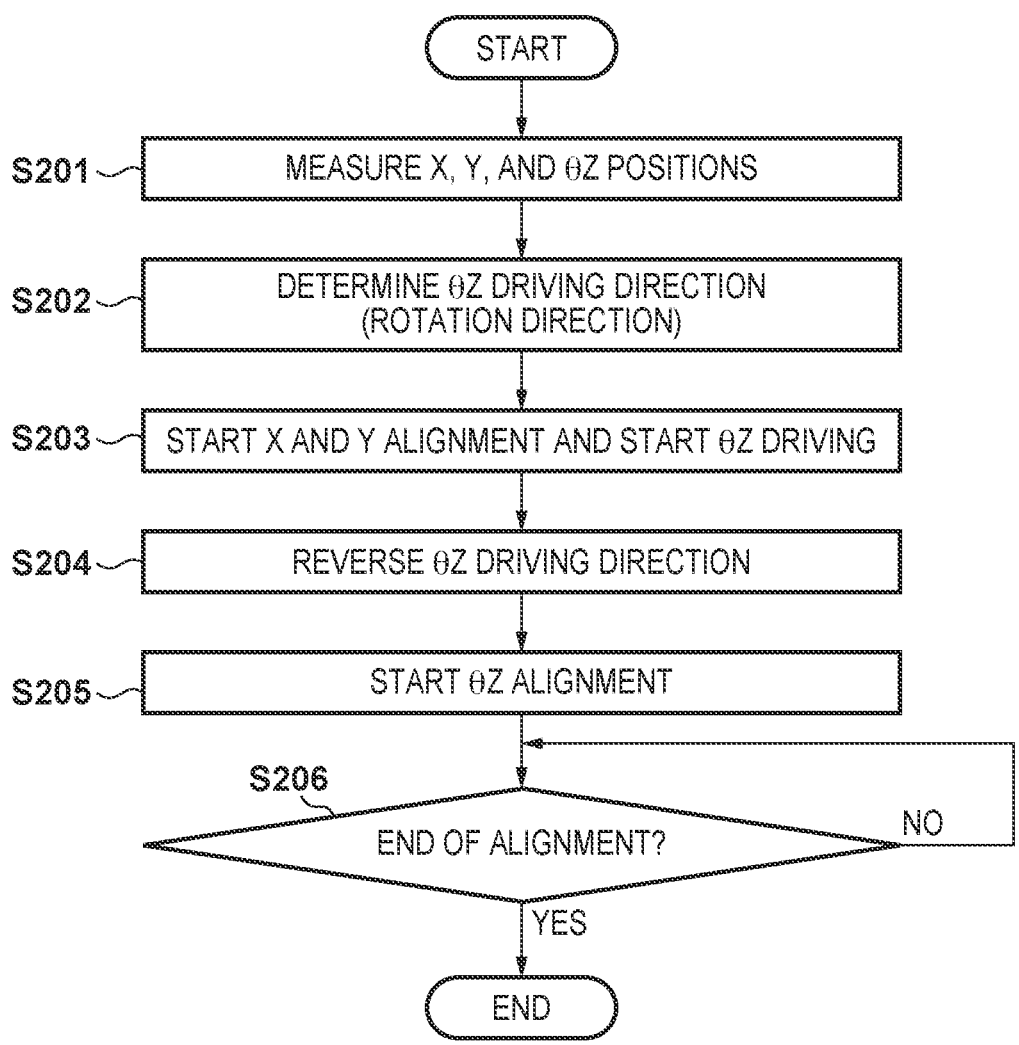
FIG. 6 is a flowchart showing the details of the alignment operation in step S104 of FIG. 3.

FIG. 6 exemplifies the details of the alignment operation in step S104 of FIG. 3. In step S201, the controller 10 uses the measurement device 9 to measure the relative positions (relative positions and rotation angle) between the pattern region 6a and the target imprint region 3a with respect to the X-axis, Y-axis, and the θZ-axis. The relative positions can be provided as Xe, Ye, and θZe for the X-axis, the Y-axis, and the θZ-axis, respectively. Here, in one example, Xe, Ye, and θZe indicate the positions of the imprint region of the substrate 3 with respect to the mold 6 as the reference. For example, if the value of Xe is negative, it means that the imprint region of the substrate 3 with respect to the mold 6 has shifted in the negative direction of the X-axis. If the value of Ye is negative, it means that the imprint region of the substrate 3 with respect to the mold 6 has shifted in the negative direction of the Y-axis. If the value of θZe is negative, it means that the imprint region of the substrate 3 with respect to the mold 6 has shifted in the negative direction of the θZ-axis.

In step S202, the controller 10 determines, for the θZ-axis, the relative driving direction (rotation direction) of the substrate 3 with respect to the mold 6 based on the measurement result in step S201. The aforementioned low velocity region is also determined by the determination of the rotation direction. The relative θZ-axis driving direction (rotation direction) is determined so the relative velocity between a part of the target imprint region of the substrate 3 and the mold 6 does not exceed the threshold. Typically, the relative θZ-axis driving direction (rotation direction) is determined so the relative velocity between a part of the target imprint region and the mold 6 does not exceed the threshold and so that the relative velocities between other parts of the target imprint region and the mold 6 exceed the threshold. The time required for alignment can be reduced and overshooting can be suppressed by this determination method.

The determination of the relative θZ-axis driving direction (rotation direction) and the low velocity region of the substrate 3 with respect to the mold 6 will be described with reference to FIGS. 7A to 7C. FIG. 7A shows an example in which the imprint region SR has been divided into the plurality of partial regions R1 to R4. The mold 6 also includes a plurality of partial regions that correspond with the partial regions R1 to R4. Although the imprint region SR has been divided into four partial regions, it may be divided into another number (for example, 2, 3, 5, or 6) of partial regions.

In the alignment operation that is accompanied by the rotation operation, the relative velocity between the imprint region SR and the mold 6 becomes low in one of the four partial regions. For example, the relative velocity becomes low in the partial region R3 when the imprint region SR is relatively driven with respect to the mold 6 in all of the X-axis, the Y-axis, and the θZ-axis directions so as to have the rotation center of the θZ-axis in the partial region R3, as shown in FIG. 7B. This principle can be used to determine the low velocity region in accordance with the table of FIG. 7C based on the signs of the relative positions (positions and the rotation angle shift) Xe, Ye, and θZe of the imprint region SR with respect to the mold 6. For example, as described above, if the imprint region SR is to be relatively driven with respect to the mold 6 in the positive direction for all of the X-axis, Y-axis, and the θZ-axis, it means that all of Xe, Ye, and θZe have negative signs. In this case, the partial region R3 is selected in accordance with the table of FIG. 7C. In this embodiment, as will be described below, alignment by feedback control with respect to the X-axis and the Y-axis (translation operation) is performed initially in the alignment operation, and alignment by feedback control with respect to the θZ-axis (rotation operation) is also performed from partway through the alignment operation. In the feedback control with respect to the θZ-axis, it is preferable to determine the low velocity region in accordance with the sign of θZe in order to decrease the θZ-axis driving amount.

In step S203, the controller 10 starts performing alignment by feedback control with respect to the X-axis and the Y-axis (translation operation). More specifically, the controller 10 starts performing alignment by feedback control in which the substrate stage 4 is driven based on the relative positions (control errors) between the imprint region SR and the mold 6 with respect to the X-axis and the Y-axis which has been successively measured using the measurement device 9. Also, in step S203, the controller 10 starts the operation to relatively rotate the imprint region SR (substrate) with respect to the mold 6 in accordance with the relative θZ-axis driving direction (rotation direction) of the imprint region SR of the substrate 3 with respect to the mold 6 determined in step S202. This operation corresponds to the first operation exemplified in FIG. 4B. In the first operation, the relative θZ-axis rotation amount is feedforward controlled so as to maintain the low velocity region. That is, the relative θZ-axis rotation amount in the first operation is controlled without feedback control based on control errors. The target value in feedforward control is determined in real time so as to maintain the low velocity region based on the result successively measured by the measurement unit 9. Alternatively, based on the result measured in step S201, a θZ-axis instruction data string (target value) on a time axis can be predetermined so as to maintain the low velocity region, and the relative θZ-axis rotation amount can be controlled based on this instruction data string.

Figure 8:
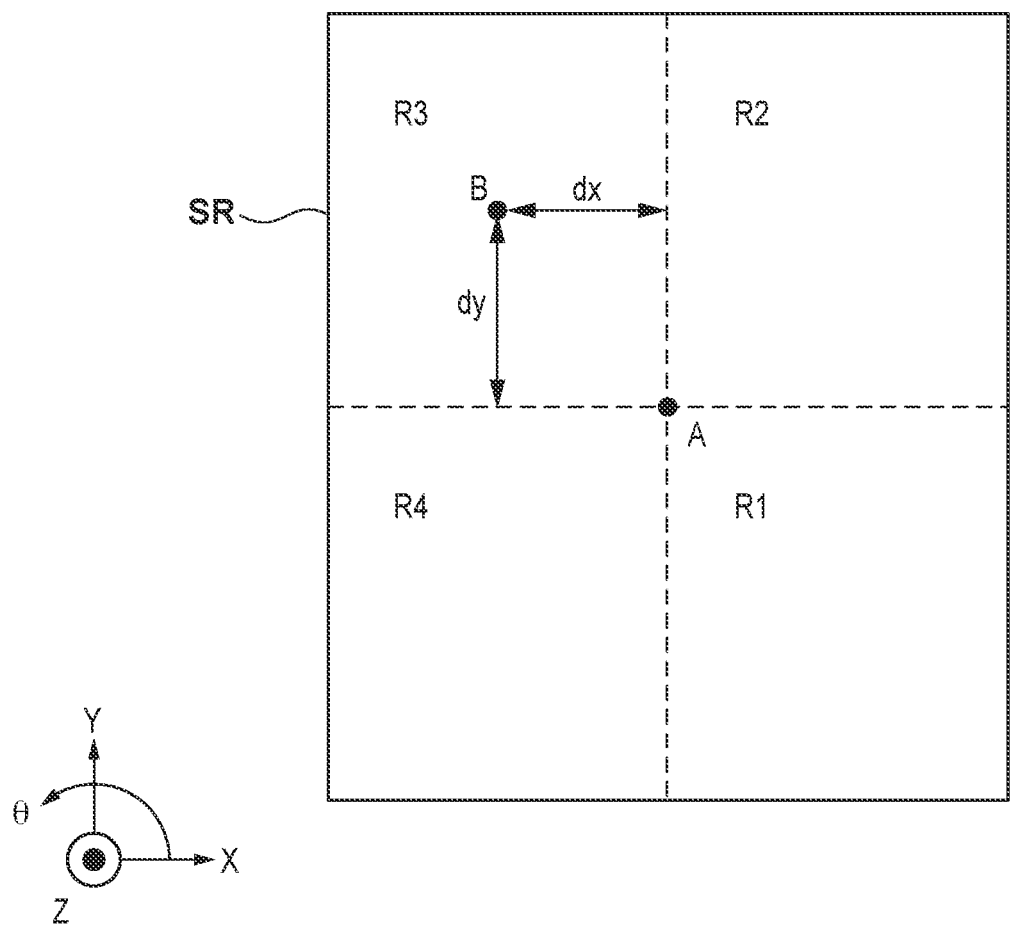
FIG. 8 is a view for explaining a method of determining a rotation amount.

A reference for determining the relative θZ-axis driving amount (rotation amount) of the imprint region SR of the substrate 3 with respect to the mold 6 will be described with reference to FIG. 8. Let A be the center point of the imprint region SR, B be the center point of the low velocity region (here, the partial region R3), dx be the distance between A and B in the X direction, and dy be the distance between A and B in the Y direction. Let XA and YA be the distances between point A and the mold 6 in the X and Y directions, respectively. If the θZ-axis driving amount θ is very small, the distances between point B and the mold 6 in the X and Y directions can be approximated as $$XB=XA-dy/\theta, YB=YA-dx/\theta \quad (1)$$

Since dx and dy do not vary with time, letting VXA and VYA be the relative velocities of point A, and θv be the driving velocity of the θZ-axis, the relative velocities VXB and VYB between point B and the mold 6 in the X and Y directions can be obtained by $$VXB=VXA-dy/\theta v, VYB=VYA-dx/\theta v \quad (2)$$

Since the viscoelasticity of the imprint material 11 changes in accordance with the relative velocity, the θZ-axis driving amount is determined so that VXB and VYB will be smaller than a predetermined velocity threshold Vs. The velocity threshold Vs is set by measuring the velocity dependency of the viscoelasticity of the imprint material 11 by an experiment in advance to check the value in which a rapid change in viscoelasticity does not occur. Although the θZ-axis driving amount is determined so that the relative velocity is equal to or less than the velocity threshold Vs at point B, the velocity threshold Vs may be exceeded at point B if the θZ-axis driving amount shifts from the calculated value. However, even in that case, since the relative velocity is within the velocity threshold Vs near point B, some errors are tolerated. Hence, equation (2) serves as a measure.

Since the change in viscoelasticity becomes small in the low velocity region when the imprint region is views as a whole, rapid relative movement of the substrate 3 and the mold 6 can be suppressed. If the substrate 3 and the mold 6 are relatively moved only in the X and Y directions without following the principle of this embodiment, the viscoelasticity rapidly decreases for the entire imprint region. As a result, a rapid relative movement occurs, and overshooting of exceeding the target position may occur. According to the principle of this embodiment, since the low velocity region acts as a brake, overshooting is suppressed. The alignment by feedback control with respect to the X-axis and the Y-axis (translation operation) started in step S203 is continued until the shifts between the mold 6 and the imprint region SR with respect to the X-axis and the Y-axis measured using the measurement device 9 are within allowable ranges.

In step S204, the controller 10 reverses the θZ-axis driving (rotation) direction. The operation following the reversal of the direction corresponds to the second operation exemplified in FIG. 4C. The reason for reversing the θZ-axis driving direction partway through the alignment operation is as follows. If the θZ-axis driving (rotation) started in step S203 is continued without changing the rotation direction, the relative shift (rotation angle) with respect to the θZ-axis becomes too large, and it will subsequently require a long time since the relative position with respect to the θZ-axis is set as the target value. If the θZ-axis driving direction is reversed partway through the alignment operation, it can prevent the relative shift (rotation angle) with respect to the θZ-axis from becoming too large. For example, if θe is very small, it is preferable to reverse the θZ-axis driving direction at the point when Xe and Ye become half of their initial values. The shift amount of the θZ-axis at the point when the alignment operation (translation operation) with respect to the X-axis and the Y-axis ends can be suppressed small by reversing the θZ-axis driving direction. The low velocity region is changed by reversing the θZ-axis driving direction. The time required for the alignment operation can be reduced by reversing the θZ-axis driving direction or changing the low velocity region halfway through the alignment operation. The θZ-axis driving direction can be reversed a plurality of times while the alignment operation with respect to the X-axis and the Y-axis is executed. In other words, the rotation operation in the alignment operation can include, in addition to the aforementioned first and second operations, a third operation of relatively rotating the imprint region SR with respect to the mold 6. The third operation is an operation in which the rotation operation is ended by its end, and another operation in which the imprint region SR is relatively rotated with respect to the mold 6 may be included between the second operation and the third operation. The relative rotation direction in the third operation is the opposite direction to the relative rotation direction of the immediately preceding operation (for example, the second operation when the third operation is successively performed after the second operation).

In step S205, the controller 10 starts alignment by feedback control with respect to the θZ-axis (rotation operation). More specifically, the controller 10 starts alignment in which the substrate stage 4 is driven by feedback control based on the relative positions between the mold 6 and the imprint region SR with respect to the θZ-axis that are successively measured by using the measurement device 9. That is, if the rotation operation of the alignment operation is to end upon the end of the second operation by steps S204 and S205, feedback control can be performed from at least partway through the second operation. Alternatively, if the rotation operation of the alignment operation is to end upon the end of the third operation, feedback control can be performed from at least partway through the third operation. In the first operation, feedforward control of the relative θZ-axis rotation amount is performed to maintain the low velocity region. In a case in which the rotation operation of the alignment operation is to end upon the end of the third operation, the relative θZ-axis rotation amounts in the respective first and second operations are controlled without feedback control based on control errors.

The start timing of step S205 can be determined by the controller 10 based on the control errors (measurement result errors with respect to the target value) with respect to the X-axis and the Y-axis and the relative position (rotation angle) between the mold 6 and the imprint region SR with respect to the θZ-axis. For example, the start timing can be determined so that the point when feedback control with respect to an axis having a larger control error out of the X-axis and the Y-axis ends and the point when feedback control with respect to the θZ-axis ends will be within an allowable time difference.

In step S206, the controller 10 repeats a process to determine whether feedback control with respect to the X-axis, the Y-axis, and the θZ-axis has ended. This process is a process to determine whether the relative positions (positions and rotation angle) between the mold 6 and the imprint region SR are within the allowable ranges of the target values with respect to the X-axis, the Y-axis, and the θZ-axis. The process (alignment operation) shown in FIG. 6 ends at the point when it is determined that feedback control with respect to the X-axis, the Y-axis, and the θZ-axis has ended.

Figure 9:
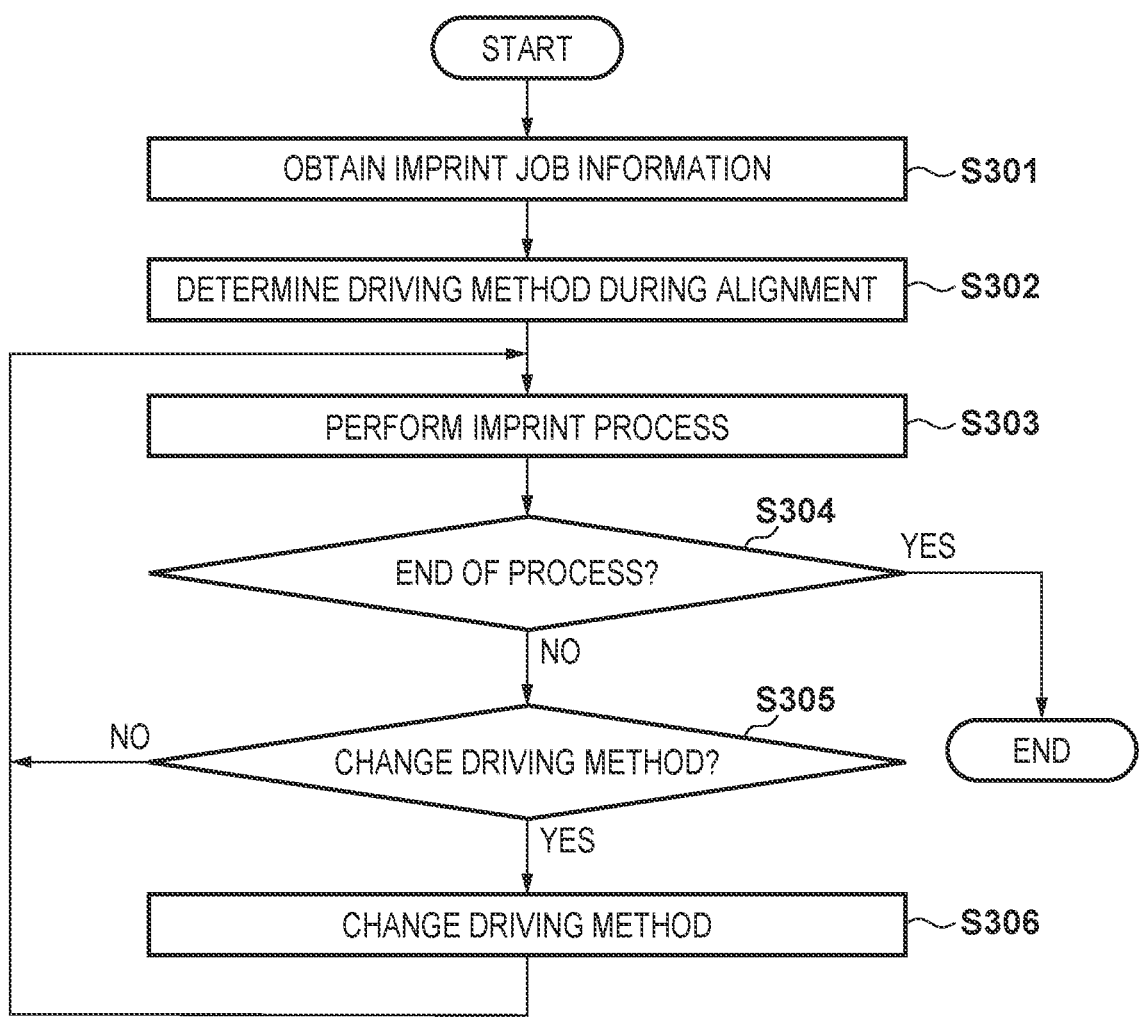
FIG. 9 is a flowchart showing a driving sequence that allows switching between pivot driving and normal driving.

Driving that forms a low velocity region which relatively moves at a velocity lower than other regions, as described above, will be referred to as pivot driving, and driving in which feedback control with respect to the X-axis, the Y-axis, and the θZ-axis is performed from the start of the alignment operation will be referred to as normal driving. If pivot driving is performed in a condition in which pivot driving is unnecessary, it may, on the contrary, increase the time required for the alignment operation. Hence, driving may be switched in accordance with the conditions of the imprint process. FIG. 9 shows a driving sequence in which switching between pivot driving (first alignment operation) and normal driving (the second alignment operation or another alignment operation) is possible.

In step S301, the controller 10 obtains imprint job information. The imprint job information is job information for a process to form a pattern by imprinting. The imprint job information can include, for example, information regarding the mold 6, information regarding the substrate 3, and information (for example, type) regarding the imprint material 11. In addition, the imprint job information can include information regarding imprint conditions such as the amount of imprint material 11 to be supplied on the substrate 3, the thickness of the imprint material 11 after the concave portion of the pattern region 6a is filled with the imprint material, and the pressing force. The imprint job information can also include information regarding imprint conditions such as the type of the substrate 3 and the position of the imprint region.

In step S302, the controller 10 selects, based on the imprint job information, pivot driving or normal driving as the driving method (or the alignment operation) during alignment. For example, the controller 10 can determine the driving method by referring to a database DB (see FIG. 1). For example, information indicating the viscoelasticity property, information indicating which of the driving methods, pivot driving or normal driving, is suitable, and information indicating which of the driving methods, pivot driving or normal driving, has been performed in the past can be registered in the database DB in association with the type of imprint material. The controller 10 can select a driving method registered in the database DB when the imprint conditions provided by the imprint job information obtained in step S301 match the information registered in the database DB. When the imprint conditions provided by the imprint job information obtained in step S301 do not match the information registered in the database DB, the controller 10 selects a driving method registered in the database DB having conditions close to the imprint conditions.

In step S303, the controller 10 executes an imprint process by the driving method (pivot driving or normal driving) determined in step S302. At this time, the controller 10 registers log information of the imprint process. The log information can include, for example, information indicating the change in the relative positions between the mold 6 and the substrate 3, information (for example, a current value) regarding the force required to drive the substrate 3 by the substrate stage 4 for the alignment operation, and information indicating the time required for the alignment operation. In step S304, the controller 10 determines whether all of the imprint processes (for example, the imprint process on the whole imprint region) have ended and executes step S305 if the processes have not ended. In step S305, the controller 10 determines, based on the log information recorded in step S303, whether the driving method needs to be changed. For example, if the information (for example, the current value) regarding the force required to drive the substrate 3 by the substrate stage 4 for the alignment operation exceeds the reference value, the controller 10 can determine that the driving method should be changed from normal driving to pivot driving. Alternatively, if at least one of the information indicating the time required for the alignment operation exceeds the reference value, the controller 10 can determine that the driving method should be changed from normal driving to pivot driving.

If the controller 10 determines that the driving method should be changed, the controller 10 changes the driving method in step S306, and the process returns to step S303. On the other hand, if the controller 10 does not determine that the driving method should be changed, the process returns to step S303 without any change to the driving method.

A method of manufacturing an article according to an embodiment of the present invention is suitable for manufacturing an article such as a microdevice such as a semiconductor device or an element having a microstructure. This method of manufacturing an article according to this embodiment can include a step of forming a pattern on an imprint material supplied onto a substrate by using the above imprint apparatus (a step of performing an imprint process on the substrate) and a step of processing the substrate on which the pattern has been formed in the preceding step. The manufacturing method further includes other known steps (oxidation, film formation, deposition, doping, planarization, etching, resist removal, dicing, bonding, packaging, and the like). The method of manufacturing an article according to this embodiment is superior to the conventional method in at least one of the performance of an article, quality, productivity, and production cost.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-054467, filed Mar. 17, 2016, which is hereby incorporated by reference herein in its entirety.

What is claimed is:

1. An imprint apparatus that forms a pattern on an imprint region of a substrate by bringing a mold into contact with an imprint material on the imprint region and curing the imprint material, the apparatus comprising:
 a controller configured to control an alignment operation of adjusting a relative position between the mold and the imprint region in a state in which the mold is in contact with the imprint material,
 wherein the alignment operation includes a translation operation of performing a relative translation between the imprint region and the mold, and a rotation operation of performing a relative rotation between the imprint region and the mold,
 wherein in the alignment operation, the controller sequentially performs a first operation including the relative rotation between the imprint region and the mold in the state in which the mold is in contact with the imprint material, and a second operation including the relative rotation between the imprint region and the mold in the state in which the mold is in contact with the imprint material, a relative rotation direction between the imprint region and the mold in the second operation being opposite to a relative rotation direction between the imprint region and the mold in the first operation, and
 wherein the controller performs the first operation and the second operation such that a partial region, of a plurality of partial regions of the imprint region, whose moving amount in the first operation is the smallest among those of the plurality of partial regions is different from a partial region, of the plurality of partial regions, whose moving amount in the second operation is the smallest among those of the plurality of partial regions.

2. The apparatus according to claim 1, further comprising a measurement device configured to measure the relative position between the mold and the imprint region,
 wherein the controller is configured to control the alignment operation based on a measurement result obtained using the measurement device.

3. The apparatus according to claim 2, wherein the controller is configured to determine the relative rotation direction in the first operation based on a measurement result obtained using the measurement device.

4. The apparatus according to claim 2, wherein the controller is configured to:
 perform feedback control of the translation operation based on a measurement result obtained using the measurement device;
 control the first operation without feedback control thereof; and
 perform feedback control of the second operation based on a measurement result obtained using the measurement device at least after an intermediate point of the second operation.

5. The apparatus according to claim 2, wherein the rotation operation further includes a third operation as an operation which is performed after the second operation, the rotation operation ending upon ending of the third operation, and
 the controller is configured to:
 perform feedback control of the translation operation based on a measurement result obtained using the measurement device;
 control the first operation and the second operation without feedback control thereof, and
 perform feedback control of the third operation based on a measurement result obtained using the measurement device at least after an intermediate point of the third operation.

6. The apparatus according to claim 2, wherein the controller is configured to select one of the alignment operation and another alignment operation, the another alignment operation being an operation of performing feedback control of relative translation and relative rotation between the mold and the imprint region based on a measurement result obtained using the measurement device from a start point of the other alignment operation, and
 wherein the controller is configured to control an operation of adjusting the relative position between the mold and the imprint region in accordance with the selected one of the alignment operation and the another alignment operation.

7. The apparatus according to claim 6, wherein the controller is configured to obtain information of a job for forming the pattern and select one of the alignment operation and the another alignment operation based on the information.

8. The apparatus according to claim 6, wherein the controller is configured to select one of the alignment operation and the another alignment operation based on information of a log of a process for forming the pattern.

9. The apparatus according to claim 1, wherein the controller is configured to control the rotation operation such that a relative velocity between the mold and at least a part of the imprint region does not exceed a threshold.

10. The apparatus according to claim 1, wherein the controller is configured to control the rotation operation such that a relative velocity between the mold and a part of the imprint region does not exceed a threshold and a relative velocity between the mold and another part of the imprint region exceeds the threshold.

11. An imprint apparatus that forms a pattern on an imprint region of a substrate by bringing a mold into contact with an imprint material on the imprint region and curing the imprint material, the apparatus comprising:
- a controller configured to control an alignment operation of adjusting a relative position between the mold and the imprint region in a state in which the mold is in contact with the imprint material,
- wherein the imprint region includes a plurality of partial regions including a first partial region and a second partial region,
- wherein the alignment operation includes a translation operation of performing a relative translation between the imprint region and the mold, and a rotation operation of performing a relative rotation between the imprint region and the mold,
- wherein in the alignment operation, the controller sequentially performs a first operation including the relative rotation between the imprint region and the mold such that a relative velocity between the mold and the first partial region is lower than a relative velocity between the mold and the second partial region, and a second operation including the relative rotation between the imprint region and the mold such that a relative velocity between the mold and the second partial region is lower than a relative velocity between the mold and the first partial region, and
- wherein the controller performs the first operation and the second operation such that a moving amount of the first partial region in the first operation is the smallest among those of the plurality of partial regions, and a moving amount of the second partial region in the second operation is the smallest among those of the plurality of partial regions.

* * * * *